US007810059B1

(12) United States Patent
Trimberger

(10) Patent No.: US 7,810,059 B1
(45) Date of Patent: Oct. 5, 2010

(54) METHODS OF ENABLING THE VALIDATION OF AN INTEGRATED CIRCUIT ADAPTED TO RECEIVE ONE OF A PLURALITY OF CONFIGURATION BITSTREAMS

(75) Inventor: Stephen M. Trimberger, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 421 days.

(21) Appl. No.: 11/974,387

(22) Filed: Oct. 11, 2007

(51) Int. Cl.
*G06F 17/50* (2006.01)
*G06F 9/45* (2006.01)
(52) U.S. Cl. .................................. 716/4; 716/6; 716/16
(58) Field of Classification Search .................... 716/4, 716/6, 16
See application file for complete search history.

(56) References Cited

U.S. PATENT DOCUMENTS

| | | | |
|---|---|---|---|
| 4,698,760 A * | 10/1987 | Lembach et al. ............... 716/6 |
| 4,899,067 A | 2/1990 | So et al. |
| 5,153,880 A | 10/1992 | Owen et al. |
| 5,255,227 A | 10/1993 | Haeffele |
| 5,349,248 A | 9/1994 | Goetting et al. |
| 5,430,734 A | 7/1995 | Gilson |
| 5,434,514 A | 7/1995 | Cliff et al. |
| 5,459,342 A | 10/1995 | Nogami et al. |
| 5,485,102 A | 1/1996 | Cliff et al. |
| 5,498,975 A | 3/1996 | Cliff et al. |
| 5,513,144 A | 4/1996 | O'Toole |
| 5,521,837 A | 5/1996 | Frankle et al. |
| 5,581,738 A | 12/1996 | Dombrowski |
| 5,592,102 A | 1/1997 | Lane et al. |
| 5,659,484 A | 8/1997 | Bennett et al. |
| 5,689,516 A | 11/1997 | Mack et al. |
| 5,742,556 A | 4/1998 | Tavrow et al. |
| 5,761,483 A | 6/1998 | Trimberger |
| 5,764,577 A | 6/1998 | Johnston et al. |
| 5,777,887 A | 7/1998 | Marple et al. |
| 5,796,750 A | 8/1998 | Lottridge et al. |
| 5,925,920 A | 7/1999 | MacArthur et al. |
| 5,931,959 A | 8/1999 | Kwiat |
| 5,963,463 A | 10/1999 | Rondeau, II et al. |
| 5,991,215 A | 11/1999 | Brunelle |
| 5,996,096 A | 11/1999 | Dell et al. |
| 6,003,150 A | 12/1999 | Stroud et al. |
| 6,028,445 A | 2/2000 | Lawman |
| 6,107,821 A | 8/2000 | Kelem et al. |

(Continued)

OTHER PUBLICATIONS

U.S. Appl. No. 10/714,380, filed Oct. 31, 2003 by Trimberger.

(Continued)

*Primary Examiner*—Jack Chiang
*Assistant Examiner*—Magid Y Dimyan
(74) *Attorney, Agent, or Firm*—John J. King

(57) ABSTRACT

Methods of enabling the validation of an integrated circuit adapted to receive one of a plurality of configuration bitstreams for a circuit design is disclosed. The method comprises analyzing a plurality of implementations for the circuit design; determining minimum timing constraints based upon all of the implementations for the circuit design; generating a representative implementation, based upon the plurality of implementations, which meets the determined minimum timing constraints for all of the implementations of the circuit design; and outputting the representative implementation.

20 Claims, 6 Drawing Sheets

U.S. PATENT DOCUMENTS

| | | | |
|---|---|---|---|
| 6,150,839 A | 11/2000 | New et al. | |
| 6,166,559 A | 12/2000 | McClintock et al. | |
| 6,167,558 A | 12/2000 | Trimberger | |
| 6,172,520 B1 | 1/2001 | Lawman et al. | |
| 6,172,521 B1 | 1/2001 | Motomura | |
| 6,201,404 B1 | 3/2001 | Reddy et al. | |
| 6,202,182 B1 | 3/2001 | Abramovici et al. | |
| 6,247,147 B1 | 6/2001 | Beenstra et al. | |
| 6,279,146 B1 | 8/2001 | Evans et al. | |
| 6,289,292 B1 | 9/2001 | Charlton et al. | |
| 6,292,925 B1 | 9/2001 | Dellinger et al. | |
| 6,311,316 B1 | 10/2001 | Huggins et al. | |
| 6,326,806 B1 | 12/2001 | Fallside et al. | |
| 6,344,755 B1 | 2/2002 | Reddy et al. | |
| 6,366,117 B1 | 4/2002 | Pang et al. | |
| 6,496,971 B1 | 12/2002 | Lesea et al. | |
| 6,530,071 B1 | 3/2003 | Guccione et al. | |
| 6,560,740 B1 | 5/2003 | Zuraski, Jr. et al. | |
| 6,594,610 B1 | 7/2003 | Toutounchi et al. | |
| 6,606,729 B2 * | 8/2003 | Gross et al. | 716/1 |
| 6,618,686 B2 | 9/2003 | Allamsetty | |
| 6,664,808 B2 | 12/2003 | Ling et al. | |
| 6,668,237 B1 | 12/2003 | Guccione et al. | |
| 6,681,353 B1 | 1/2004 | Barrow | |
| 6,704,889 B2 | 3/2004 | Veenstra et al. | |
| 6,725,442 B1 | 4/2004 | Cote et al. | |
| 6,744,274 B1 | 6/2004 | Arnold et al. | |
| 6,748,456 B1 | 6/2004 | Dangat et al. | |
| 6,779,133 B2 | 8/2004 | Whetsel | |
| 6,807,631 B2 | 10/2004 | Fuller et al. | |
| 6,817,005 B2 | 11/2004 | Mason et al. | |
| 6,817,006 B1 | 11/2004 | Wells et al. | |
| 6,839,792 B2 | 1/2005 | Feldstein et al. | |
| 6,864,710 B1 | 3/2005 | Lacey et al. | |
| 6,915,503 B1 | 7/2005 | Lesea | |
| 6,918,027 B2 | 7/2005 | Mantey et al. | |
| 6,924,663 B2 | 8/2005 | Masui et al. | |
| 6,925,407 B2 | 8/2005 | Duppong | |
| 6,961,884 B1 | 11/2005 | Draper | |
| 6,973,608 B1 | 12/2005 | Abramovici et al. | |
| 7,007,250 B1 | 2/2006 | Bapat et al. | |
| 7,045,472 B2 | 5/2006 | Cooney et al. | |
| 7,047,465 B1 | 5/2006 | Trimberger | |
| 7,071,679 B1 | 7/2006 | Sabih et al. | |
| 7,076,595 B1 | 7/2006 | Dao et al. | |
| 7,080,300 B1 | 7/2006 | Herron et al. | |
| 7,089,466 B2 | 8/2006 | Odom et al. | |
| 7,124,391 B1 | 10/2006 | Patterson | |
| 7,127,697 B1 | 10/2006 | Wells et al. | |
| 7,133,822 B1 | 11/2006 | Jacobson | |
| 7,143,378 B1 | 11/2006 | Nag | |
| 7,146,598 B2 | 12/2006 | Horanzy | |
| 7,180,324 B2 | 2/2007 | Chan et al. | |
| 7,185,293 B1 | 2/2007 | Ofer | |
| 7,185,295 B2 | 2/2007 | Park et al. | |
| 7,187,198 B2 | 3/2007 | Akimichi | |
| 7,187,597 B1 | 3/2007 | Trimberger | |
| 7,209,794 B2 | 4/2007 | Duppong | |
| 7,216,277 B1 | 5/2007 | Ngai et al. | |
| 7,219,278 B2 | 5/2007 | Avery et al. | |
| 7,227,364 B1 | 6/2007 | Fan et al. | |
| 7,228,521 B1 | 6/2007 | Ma et al. | |
| 7,233,532 B2 | 6/2007 | Vadi et al. | |
| 7,240,218 B2 | 7/2007 | Kean | |
| 7,249,010 B1 | 7/2007 | Sundararajan et al. | |
| 7,251,804 B1 | 7/2007 | Trimberger | |
| 7,269,765 B1 | 9/2007 | Charlton et al. | |
| 7,284,159 B2 | 10/2007 | Chakraborty et al. | |
| 7,284,229 B1 | 10/2007 | Trimberger | |
| 7,307,442 B2 | 12/2007 | Ong | |
| 7,362,135 B1 | 4/2008 | Chang | |
| 7,363,560 B1 | 4/2008 | Mark et al. | |
| 7,412,635 B1 | 8/2008 | Trimberger | |
| 7,424,655 B1 | 9/2008 | Trimberger | |
| 7,469,394 B1 * | 12/2008 | Hutton et al. | 716/6 |
| 7,509,445 B2 | 3/2009 | Odom et al. | |
| 7,512,922 B1 | 3/2009 | Stenz | |
| 7,657,855 B1 | 2/2010 | Manaker et al. | |
| 2003/0212940 A1 | 11/2003 | Wong | |
| 2004/0193979 A1 | 9/2004 | Avery et al. | |
| 2005/0125512 A1 | 6/2005 | Fuller et al. | |
| 2005/0257178 A1 * | 11/2005 | Daems et al. | 716/2 |
| 2006/0259871 A1 | 11/2006 | Washington et al. | |
| 2006/0282733 A1 | 12/2006 | Whetsel | |

OTHER PUBLICATIONS

U.S. Appl. No. 10/813,414, filed Mar. 29, 2004 by Stassart et al.
U.S. Appl. No. 11/895,132, filed Aug. 23, 2007, Trimberger.
U.S. Appl. No. 11/974,354, filed Oct. 11, 2007, Trimberger.
U.S. Appl. No. 11/974,355, filed Oct. 11, 2007, Trimberger et al.
U.S. Appl. No. 12/141,958, filed Jun. 19, 2008, Trimberger.
U.S. Appl. No. 12/141,959, filed Jun. 19, 2008, Trimberger.
U.S. Appl. No. 12/181,344, filed Jul. 29, 2008, Trimberger.
U.S. Appl. No. 12/181,346, filed Jul. 29, 2008, Trimberger.
Altera; Altera Data Sheet, vol. 1, Chapter 3 "Configuration and Testing"; and vol. 2 Chapter 8 "Remote System Upgrades with Stratix II Devices"; Feb. 2004; downloaded on Jun. 17, 2004 from http://www.altera.com/literature/lit-stx2.
Culbertson, W. Bruce et al.; "Defect Tolerance on the Teramac Custom Computer"; The 5th Annual IEEE Symposium on Field-Programmable Custom Computing Machines; Apr. 16-18, 1997; pp. 116-123.
Emmert, John et al.; "Dynamic Fault Tolerance in FPGAs via Partial Reconfiguration"; Annual IEEE Symposium on Field-Programmable Custom Computing Machines; Apr. 17, 2000; pp. 165-174.
Emmert, John M. et al.; "Incremental Routing in FPGAs"; ASIC Conference 1998. Proceedings, Eleventh Annual IEEE International; Rochester, NY; Sep. 13-16, 1998; pp. 217-221.
Hanchek, Fran et al.; "Node-Covering Based Defect and Fault Tolerance Methods for Increased Yield in FPGAs"; The Proceedings of the Ninth International Conference on VLSI Design; Jan. 1996; pp. 1-4.
Xilinx, Inc.; DS031 v1.1, "Virtex-II Pro Platform FPGA Handbook"; published Dec. 6, 2000; available from Xilinx, Inc., 2100 Logic Drive, San Jose, California 95124; pp. 33-75.

* cited by examiner

METHODS OF ENABLING THE VALIDATION OF AN INTEGRATED CIRCUIT ADAPTED TO RECEIVE ONE OF A PLURALITY OF CONFIGURATION BITSTREAMS

FIELD OF THE INVENTION

The present invention relates generally to integrated circuits, and in particular, to methods of enabling the validation of a programmable logic device adapted to receive one of a plurality of configuration bitstreams for a circuit design.

BACKGROUND

Integrated circuits are an integral part of any electronic device. A variety of integrated circuits are often used together to enable the operation of the electronic device. While integrated circuits are typically designed for a particular application, one type of integrated circuit which enables flexibility is a programmable logic device (PLD). A programmable logic device is designed to be user-programmable so that users may implement logic designs of their choices. One type of programmable logic device is the Complex Programmable Logic Device (CPLD). A CPLD includes two or more "function blocks" having a two-level AND/OR structure connected together and to input/output (I/O) resources by an interconnect switch matrix. Another type of programmable logic device is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., FLASH memory, as in some CPLDs), or in any other type of memory cell.

However, programmable logic devices are typically relatively complex and have physically large dice. In implementing semiconductor devices, it is important that the devices are free of defects and reliable throughout their use. When a semiconductor device fails after being installed in a device such as a consumer electronics device, such a failure may cause the entire consumer electronics device to fail. The large die size means that fewer dice are produced per wafer. Further, the chances that a physical defect, such as a dust particle on any portion of a die, may cause an electrical fault is increased. The minimum critical dimensions and number of layers of programmable logic devices also increase the possibility for electrical faults. Accordingly, programmable logic devices are tested after fabrication, and are binned according to performance, such as operating speed, as well as for pass/fail. The percentage of usable dice is called "silicon yield" because it indicates how many dice are usable. Because the number of usable dice significantly impacts profitability, it is important to enable the use of as many of the dice of the wafer as possible.

One way to enable the use of defective programmable logic devices is to avoid the use of defective logic. However, customers are generally not able to specify their board timing well enough to enable PLD design tools to ensure that the programmable logic device will meet the timing requirements of the board. Therefore, the board must be qualified. Because the timing of paths in different designs will be different, a quality-conscious customer may need to verify proper functionality of every possible bitstream in the system. If there are sixteen different possible bitstreams, the customer must qualify sixteen different systems. This qualification process may be expensive. Further, if the customer has two programmable logic devices in the system, he may need to qualify all combinations of the two programmable logic devices implementing the 16 designs, or 256 different systems. Testing that many systems would be too expensive and time-consuming for nearly all customers.

Accordingly, there is a need for an improved method of enabling the validation of a programmable logic device adapted to receive one of a plurality of configuration bitstreams for a circuit design.

SUMMARY

Methods of enabling the validation of a programmable logic device adapted to receive one of a plurality of configuration bitstreams for a circuit design is disclosed. The method comprises analyzing the plurality of implementations for the circuit design; determining minimum timing constraints based upon all of the implementations of the circuit design; generating a representative implementation, based upon the plurality of implementations, which meets the determined minimum timing constraints for all of the implementations for the circuit design; and outputting the representative implementation. The method may further comprise determining best-case and worst-case timing performances for the plurality of implementations for the circuit design, wherein determining minimum timing constraints comprises determining minimum timing constraints to meet the worst-case timing performance. The method may also comprise generating a cost function associated with the timing performance of the circuit design, and optimizing the timing of the representative implementation to the best-case performance without going under the minimum timing constraints.

According to an alternate embodiment, a method of enabling the validation of a programmable logic device adapted to receive one of a plurality of configuration bitstreams for a circuit design comprises determining best-case and worst-case timing performances for a plurality of implementations for the circuit design; determining minimum timing constraints to meet the worst-case timing performance; generating a representative implementation, based upon the plurality of implementations, which meets the determined minimum timing constraints of the plurality of implementations; optimizing the timing of the representative implementation to the best-case timing performance without going under the minimum timing constraint; and outputting the representative implementation. Determining best-case and worst-case performances for the plurality of implementations may comprise determining the best-case and worst-case performances for the plurality of implementations for all nets of the circuit design. Optimizing the timing may comprise generating a cost function which minimizes a sum of the amounts by which the minimum timing constraints for the nets is exceeded or minimizing the amount by which the minimum timing constraint for any net is exceeded. Finally, determining minimum timing constraints may comprise establishing minimum path delays between registers.

According to a further alternate embodiment, a method of enabling the validation of a programmable logic device adapted to receive one of a plurality of configuration bitstreams for a circuit design comprises analyzing the plurality of implementations for the circuit design; determining minimum timing constraints based upon all of the implementations for the circuit design; generating a representative implementation, based upon the plurality of implementations, which meets the determined minimum timing constraints for the plurality of implementations; analyzing the speed of the programmable logic device; and adjusting the speed of the programmable logic device during validation to avoid exceeding a predetermined speed. Determining minimum timing constraints may comprise determining minimum path delays between registers, determining minimum path delays between a primary input and a register, and/or determining minimum path delays between a register and a primary output.

DETAILED DESCRIPTION OF THE DRAWINGS

Figure 1:
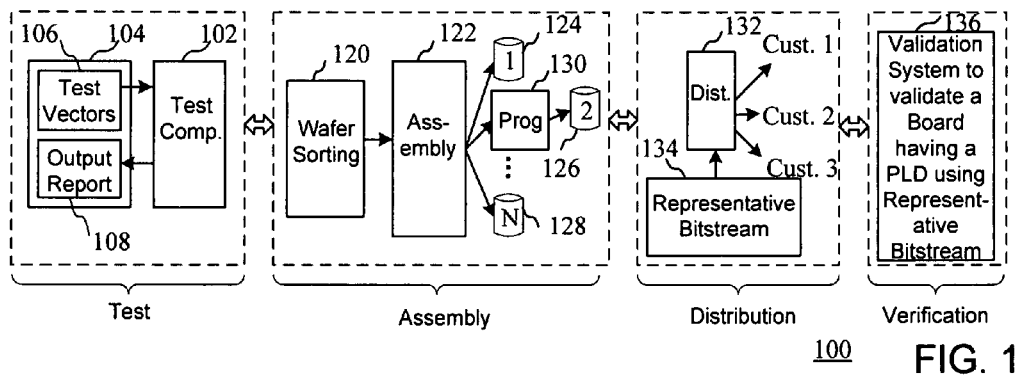
FIG. 1 is a block diagram of a system for validating a programmable logic device in a system according to an embodiment of the present invention.

Turning first to FIG. 1, a block diagram of a system for validating a programmable logic device in a system according to an embodiment of the present invention is shown. In particular, in enabling verification of a system such as a circuit board having a programmable logic device, a test computer 102 is coupled to a test program 104 comprising test vectors 106 and coupled to receive an output report 108 from the test computer 102. The test computer 102 may be any type of computer or system for testing dice of wafers to determine defects in the dice, as is well known in the art. For example, the test computer 102 may comprise a wafer tester from Credence Systems Corporation of Milpitas, Calif. or Teradyne, Inc. of North Reading, Mass. An example of a wafer having a plurality of dice, including defective dice, will be described in more detail in reference to FIG. 2. The wafers are tested in a process known as "wafer sort" before the dice are separated from the wafer. Unlike conventional wafer testing where defective dice are discarded after the dice are separated from the wafer, certain dice having defects may still be used if the defects are avoided. Tested wafers are then provided to an assembly area, where a wafer sorting device 120 enables processing a batch of wafers for assembly of dice into integrated circuit packages by an assembly tool 122. While the wafer sorting device 120 and the test computer 102 are shown as separate elements, the test computer 102 may be a part of the wafer sorting device.

The assembled devices may be binned into various bins 124-128 according to given criteria, such as speed, for example. However, according to one aspect of the present invention, integrated circuits having defective programmable logic are binned in a separate bin, and more particularly, in a common bin 126. That is, integrated circuits having defective programmable logic may be binned in a common bin regardless of the location of the defective programmable logic. Because the defective integrated circuits are commonly binned, the location of the defective programmable logic is recorded for each integrated circuit. For example, each defective integrated circuit may be separately programmed by a programmer 130 to indicate the location of the defective programmable logic. For example, the location of the defect of a given integrated circuit may be stored in a non-volatile memory of the integrated circuit. The programmer may be incorporated as a part of the assembly tool 122, or may be a separate programming computer or programming device, for example. Alternatively, a record could be created to indicate the location of a defect in a programmable logic device based upon an identifier associated with the device, such as a bar code, a serial number, or some other unique identifier for the device. That is, the device itself could be physically marked with some identifier indicating the location of a defective portion of programmable logic, or the location of the defect or defects may be re-determined when needed by a test procedure.

According to one embodiment to enable the use of defective programmable logic devices, multiple implementations of a single customer design are built. Each implementation of the customer's design performs the same function, but uses a different set of the programmable resources on the PLD and has a corresponding bitstream that can be used to program the PLD. Since each implementation has a single corresponding bitstream, we may use the terms interchangeably. In this discussion, a bitstream may refer to an implementation even though the translation from the design database to the actual bits that program the PLD has not been made. Each implementation may also have subtle timing differences. Additional details regarding identifying and storing the location of defects in an integrated circuit may be found in the U.S. patent application entitled "Methods of Enabling the Use of a Defective Programmable Logic Device", filed by the Applicant of the present application on the same date as the filing of the present application, the entire application of which is incorporated herein by reference.

Other methods of using multiple bitstreams to avoid defects include methods that do not require storage of the defect location, but instead test each device for proper functionality with a bitstream to select that bitstream. The disclosed structures and methods may be applied to verify systems that include programmable logic devices that employ this type of defect avoidance. For example, one bitstream of a plurality bitstreams is selected by trial and error, where a tested bitstream that functions correctly is selected. That is, the selected bitstream need not correspond to a programmable logic device having defects in a given region, but could be selected to be implemented in different devices after being tested and determined to function with those devices.

While the identification of the location of the defect of a defective integrated circuit is beneficial when a specific defective integrated circuit is actually implemented in a system, the plurality of devices having defects in different locations, and therefore requiring different configuration bitstreams, creates problems in validating a system having a programmable logic device, as set forth above. Accordingly, a representative bitstream 134 is generated to enable validation of a programmable logic device having any of the configuration bitstreams, as will be described in more detail below. The assembled integrated circuit packages are shipped during a distribution process, where a distribution channel 132 enables integrated circuits to be shipped to customers. During the distribution process, the integrated circuits may further be programmed with one of the plurality of configuration bitstreams for a user-specific design which avoid the defective portion of the programmable logic, or without the configuration bitstreams enabling them to instead be programmed by customers. The representative bitstream is also provided to the customers of the programmable logic devices having defective programmable logic to enable the user of the programmable logic device to validate a system having the programmable logic device using the representative bitstream.

Figure 2:
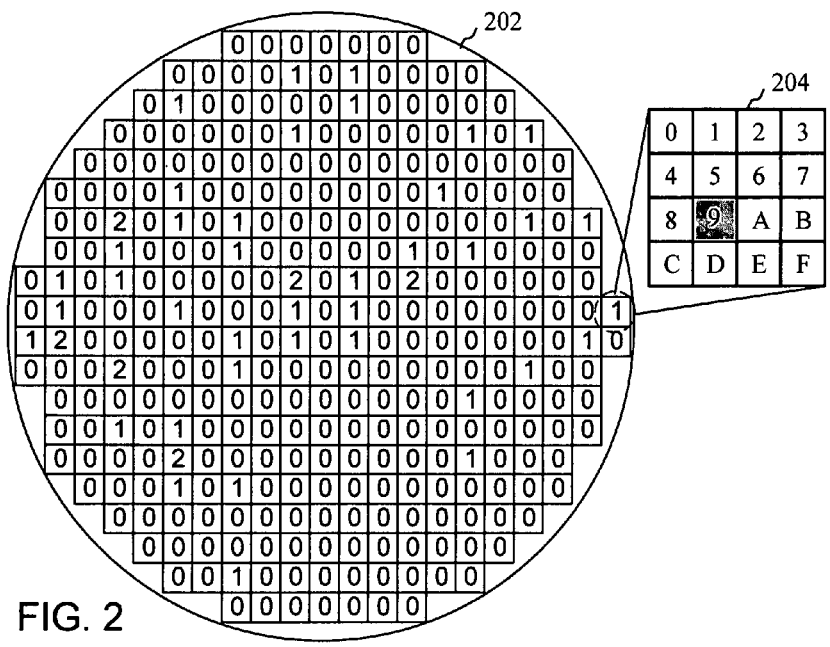
FIG. 2 is a top plan view of an integrated circuit wafer having a plurality of dice including defective dice.

Turning now to FIG. 2, a top plan view of an integrated circuit wafer having a plurality of dice including defective dice is shown. FIG. 2 shows a silicon wafer 202 having dice for programmable logic devices represented by the squares. The programmable logic devices are assigned a number showing the number of defective regions. A representative die 204 has a shaded region showing the location of the single defective region. The location of the defective region may be identified according to the physical location of the defects on the die, the functionality of the defective programmable logic, programmable logic identified by the application of predetermined test vectors, or any other designation of a region or collection of physical resources which would enable a user to avoid the defective programmable logic in the device. The regions need not be the same size or evenly distributed on the die, and identifying defective regions of a device may depend on the layout and functional design of the device. Regions need not be defined by physical locality, but may be convenient collections of physical resources that may all be avoided simultaneously by the placement and routing software. While die 204 is divided into sixteen regions, where the shaded region 9 is identified as the single defective region by way of example, the die may be defined by more or fewer regions, and/or have more than one defective region. Because defective dice may have defective programmable logic in different regions, a circuit design implemented in the different devices may operate differently, making validation of system having a circuit design implemented in programmable logic difficult. Accordingly, the representative bitstream is generated to ensure that the programmable logic device would be qualified using any of the configuration bitstreams.

Figure 3:
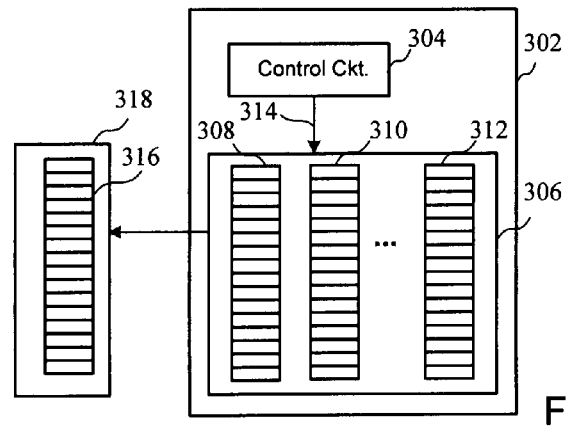
FIG. 3 is a block diagram of a system for generating a representative implementation for a programmable logic device according to an embodiment of the present invention.

According to one aspect of the invention, a representative implementation representing a worst-case design of the circuit design to be implemented in the programmable logic may be built for a customer, and the customer uses the representative design to qualify a system. As shown in the block diagram of the system for generating a representative bitstream for a programmable logic device of FIG. 3, a computer 302 comprises a control circuit 304 coupled to a memory 306 which stores a plurality of configuration bitstreams 308-312. The control circuit 304 may comprise a processor or other logic of a general purpose computer for implementing configuration software. The plurality of configuration bitstreams enables implementing a given circuit design in a plurality of programmable logic devices having defective programmable logic in different regions. For example, the memory 306 may store sixteen bitstreams comprising one bitstream for each of sixteen different devices having defective programmable logic in one of the sixteen different regions. That is, each bitstream may be used to avoid programmable logic of a given region. A representative bitstream 316 is generated based upon analysis of the sixteen configuration bitstreams, and is stored in a memory 318. The representative configuration bitstream enables the user of a programmable logic device to qualify a system employing the programmable logic device to ensure that the system employing a programmable logic device having a defect in any of the sixteen regions would also qualify. That is, if the programmable logic device having the circuit design is qualified with the representative bitstream, any programmable logic device having defective programmable logic in one of the sixteen regions would also qualify when configured with its corresponding configuration bitstream. Because the representative design is expected to run only for system qualification, the representative design may use a non-defective part, so it need not avoid any defects.

According to one embodiment, the representative bitstream is created by determining a worst-case design, and determining timing constraints based upon the worst-case design. As will be described in more detail below, the timing constraints may be based upon nets or paths, for example. A net represents a collection of interconnect lines from the output of a user logic block to inputs of the next destination block, while a path represents a sequence of nets between registers comprising a connection from a source to a specific destination. A path may be defined as a clock to clock path, such as one register to another register, a register to an output, an input to a register, or an input to an output, as is well known in the art. The worst-case and best-case performances for the plurality of bitstreams are identified for all nets in the original design implemented according to each of the sixteen configuration bitstreams. For example, because each implementation of a given design will comprise different interconnect resources defined by different configuration bitstreams, the minimum time for a signal to pass through a net will vary. In a best-case design, a signal may only need at least 5 nanoseconds (nsec) to pass through the net. In contrast, in a worst-case design, a signal may require at least 8 nsecs to pass through the net. Therefore, to ensure that the system will qualify with any of the implementations of the circuit design in various defective programmable logic devices, the representative implementation will be generated by placing and routing the design to ensure that the worst-case timing is met and that the time allowed for a net is not less than a minimum time (e.g., at least 8 nsecs is provided for each net). The representative implementation may be generated using configuration software, such as ISE Foundation software, available from Xilinx, Inc. of San Jose, Calif., or some other suitable configuration software.

A cost function may also be generated to attempt to optimize the timing to the best-case performance without going under the minimum timing constraints. That is, the resulting representative implementation will be placed and routed, and optimized to improve the cost function. The cost function may include, for example, the amount of resources used, the amount of area occupied, and/or the delay of a net or path. The components of the cost function may be weighted. For example, a cost function may be defined as A*resources+ B*delay, where A and B are weights that emphasize resource cost or delay relative to the other. A cost function may further include attempts to minimize the sum of the amount by which the minimum timing constraint is exceeded (i.e., the amount by which the sum of the delays is less than the minimum timing constraint). Such a cost function may be defined as A*resources+B*delay+C*(sum over all nets I (if delay(i)>min_delay(i) then 0 else min_delay(i)−delay(i)))). That is, a cost penalty which is weighted is assigned to any net where the delay is less than the minimum delay. Alternatively or additionally, the cost function may include attempts to minimize the maximum amount by which any minimum timing constraint is exceeded. Such a cost function may be defined as A*resources+B*delay+C*(sum over all nets I (if delay(i)>min_delay(i) then delay(i)−min_delay(i) else D*(min_delay(i)−delay(i)))). That is, a cost penalty is assigned to any net where the delay is greater than a minimum delay, and a value which is weighted is assigned to any net where the delay is less than the minimum delay. While it may be possible in some cases that the delay is less than the minimum timing constraint, the penalty may minimize the amount by which the nets go under the minimum. Further, rather than guarantee individual nets, path delays between flip-flops, from primary input to a flip-flop, or from a flip-flop to a primary output may be guaranteed. Guaranteeing delay paths is generally easier and improves the tool's opportunities to meet a maximum timing constraint.

Because the system test must be done at speed, a degradation of the worst-case delay paths may be a problem. Accordingly, traditional timing constraints for critical paths may be enforced, where all designs are then optimized to be as close as possible to the exact worst-case value. Making paths longer than the original path to meet the worst-case value may be simplified by using a larger programmable logic device. That is, because there are more interconnects in larger devices, delays may be adjusted with more detail by moving logic farther apart and creating routing paths that consume more than the minimum routing resources in order to increase delays to meet the desired worst-case delay requirement. While ensuring that minimum timing constraints are met ensures that the circuit will not be too fast, it may also be necessary to ensure that maximum timing constraints are met. That is, the maximum timing constraints ensure that the device is not too slow and that the signals will arrive within a predetermined delay in order to meet the speed performance specification of the system under test.

Figure 4:
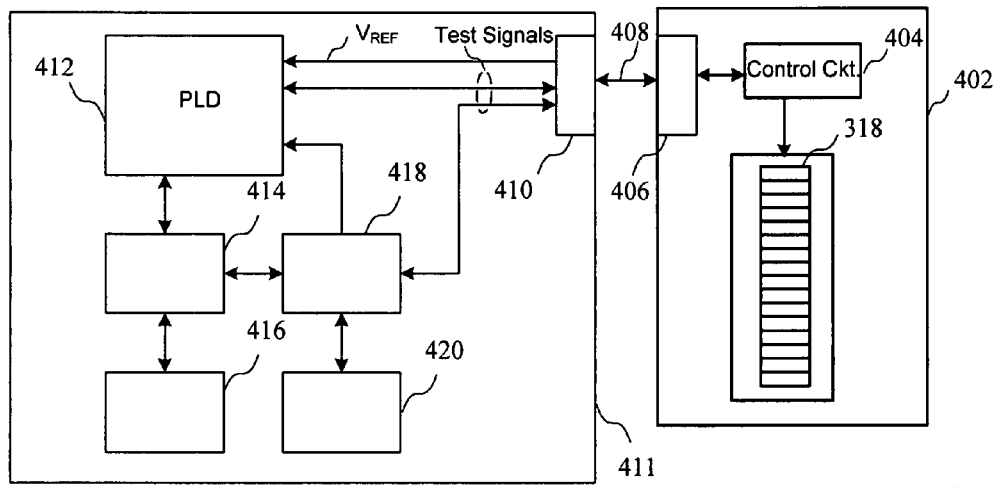
FIG. 4 is a block diagram of a device for validating a programmable logic device on a system according to an embodiment of the present invention.

Turning now to FIG. 4, a block diagram of a device for validating a programmable logic device on a system according to an embodiment of the present invention is shown. In particular, a computer 402 comprises a control circuit 404 coupled from an input/output port 406 by way of a communication link 408 to a input/output port 410 of a circuit board 411 having a programmable logic device 412. The programmable logic device is coupled to other integrated circuits or other devices 414-420, directly or indirectly. Some devices, such as device 418, may also be directly coupled to the input/output port 410. Device 418 may be a non-volatile memory for storing a configuration bitstream downloaded to the system, for example. A reference voltage $V_{REF}$ is coupled to the programmable logic device 412, as well as other devices on the board. Similarly, test signals are provided to the programmable logic device 412 and other devices to qualify the programmable logic device on the board. As shown in FIG. 4, the representative bitstream 318 is used to validate the PLD 412 on the circuit board 411. The validation of the circuit board ensures that the programmable logic device and other devices on the board meet timing requirements to interact as required. As will be described in more detail below in reference to FIG. 5, the reference voltage $V_{REF}$ may be adjusted for purposes of validating the board having the programmable logic device.

Figure 5:
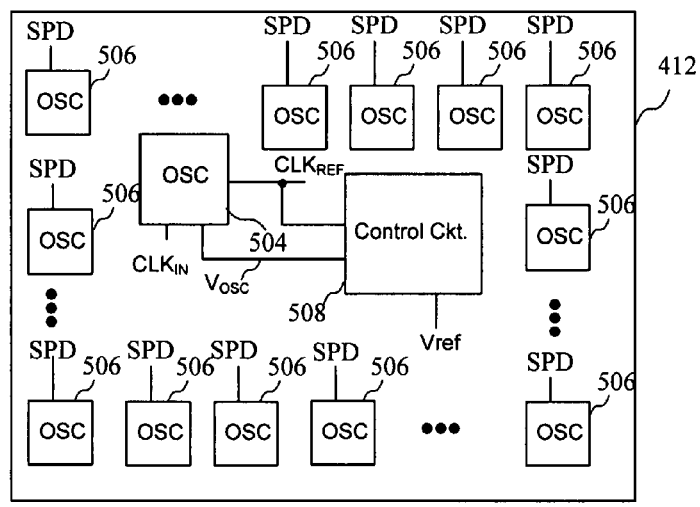
FIG. 5 is a block diagram of a programmable logic device according to an embodiment of the present invention.

Turning now to FIG. 5, a block diagram of a programmable logic device according to an embodiment of the present invention is shown. After establishing worst-case timing requirements, there is still a possibility that the actual programmable logic device used by the customer is unusually fast, thereby giving better results than promised and negating the worst-case implementation of the design. Accordingly, an oscillator 504, which is coupled to receive a voltage $V_{OSC}$ and generate an internal reference clock $CLK_{REF}$, may be implemented in programmable logic on the die to measure performance. The $CLK_{REF}$ output of the oscillator 504 may be used by the customer to adjust the reference voltage $V_{REF}$ to slow the programmable logic device down, where a greater voltage reduction is required to slow the programmable logic device down more. Alternatively, a customer verifying a system such as a circuit board or other system having devices interacting with the programmable logic device may check timing by using that oscillator and the same design in several dice, and choose the slowest die. Rather than adjusting the reference voltage, fast oscillators 506 may be added around the die to intentionally heat up the die. The oscillators are controlled by a speed (SPD) signal, wherein heating up the die will slow down the SPD signal. By comparing the $CLK_{REF}$ of the oscillator 504 with an external reference frequency, it is possible to determine the frequency of the fast oscillators 506 using a feedback path to a control circuit 508. If the $CLK_{REF}$ of oscillator 504 is faster than the external frequency, the speed of the oscillators is increased to heat the die and slow it down.

Figure 6:
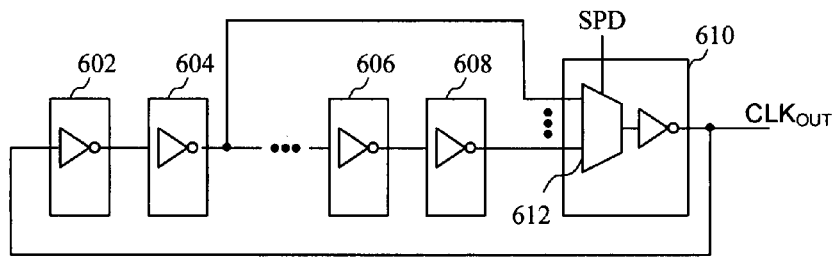
FIG. 6 is a block diagram of an oscillator of a programmable logic device enabling validation of the programmable logic device on a system according to an embodiment of the present invention.

Because the use of the fast oscillators 506 may require a large number of heaters, which may necessitate using a larger device, it may be possible to adjust a digital clock manager (DCM) to generate a different frequency, or build an adjustable oscillator frequency generator out of lookup tables (LUTs) or partially out of LUTs, where multiplexer settings may be used to bypass LUTs in the oscillator chain as shown in FIG. 6. That is, the circuit of FIG. 6 may be used as a heater or to generate a clock for distributed heaters. When used as a heater, as many as possible of the LUTs should be inverters, where an odd number of inversions is needed. In the exemplary embodiment of FIG. 6, five inverters 602-610 are coupled in series, where the last inverter 610 comprises a multiplexer 612 which is coupled to receive the outputs of the inverters 604 and 608. The speed (SPD) control signal controls the speed of the oscillator, and therefore the heat generated. The speed control signal may be set by resetting the reference oscillator count, and waiting a preset number of clock cycles of the frequency of $CLK_{REF}$. If the reference oscillator count is greater than the preset number of cycles of the external reference clock, then the speed is increased, where the faster speed generates more heat, and therefore decreases the frequency of the internal reference clock $CLK_{REF}$. If the reference oscillator count is less than the preset number of cycles of the external reference frequency, then the slower speed generates less heat, resulting in a faster internal reference oscillator.

Figure 7:
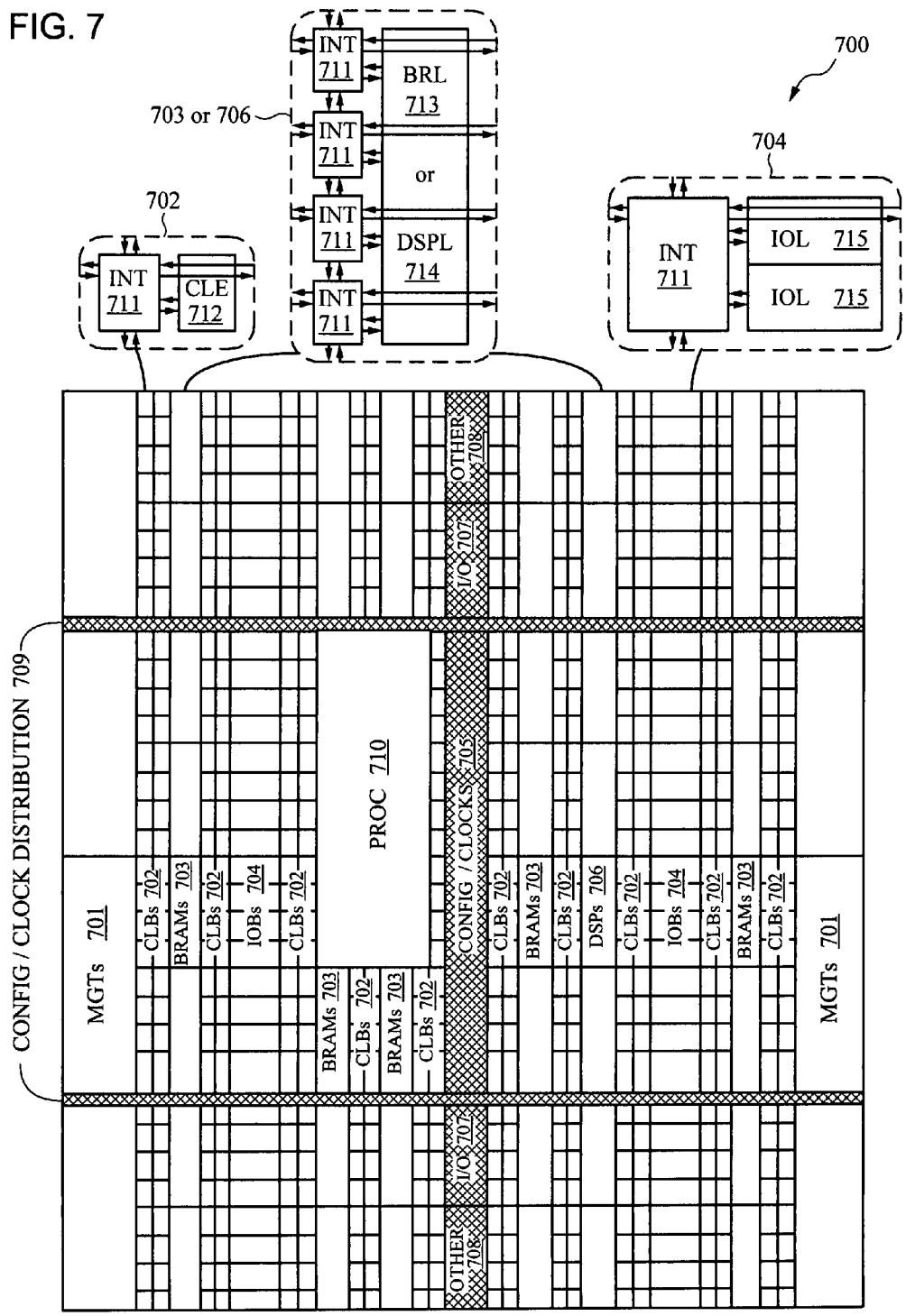
FIG. 7 is a more detailed block diagram of a programmable logic device according to an embodiment of the present invention.

Turning now to FIG. 7, as noted above, advanced FPGAs may include several different types of programmable logic blocks in the array. For example, FIG. 7 illustrates an FPGA architecture that includes a large number of different programmable tiles comprising programmable logic including multi-gigabit transceivers (MGTs 701), configurable logic blocks (CLBs 702), random access memory blocks (BRAMs 703), input/output blocks (IOBs 704), configuration and clocking logic (CONFIG/CLOCKS 705), digital signal processing blocks (DSPs 706), specialized input/output blocks (I/O 707) (e.g., configuration ports and clock ports), and other programmable logic 708 such as digital clock managers, analog-to-digital converters, system monitoring logic, and so forth. Some FPGAs also include dedicated processor blocks (PROC 710).

In some FPGAs, each programmable tile includes a programmable interconnect element (INT 711) having standardized connections to and from a corresponding interconnect element in each adjacent tile. Therefore, the programmable interconnect elements taken together implement the programmable interconnect structure for the illustrated FPGA. The programmable interconnect element (INT 711) also includes the connections to and from the programmable logic element within the same tile, as shown by the examples included at the top of FIG. 7.

For example, a CLB 702 may include a configurable logic element (CLE 712) that may be programmed to implement user logic plus a single programmable interconnect element (INT 711). A BRAM 703 may include a BRAM logic element (BRL 713) in addition to one or more programmable interconnect elements. Typically, the number of interconnect elements included in a tile depends on the height of the tile. In the pictured embodiment, a BRAM tile has the same height as four CLBs, but other numbers (e.g., five) may also be used. A DSP tile 706 may include a DSP logic element (DSPL 714) in addition to an appropriate number of programmable interconnect elements. An IOB 704 may include, for example, two instances of an input/output logic element (IOL 715) in addition to one instance of the programmable interconnect element (INT 711). As will be clear to those of skill in the art, the actual I/O pads connected, for example, to the I/O logic element 715 typically are not confined to the area of the input/output logic element 715.

In the pictured embodiment, a columnar area near the center of the die (shown shaded in FIG. 7) is used for configuration, clock, and other control logic. Horizontal areas 709 extending from this column are used to distribute the clocks and configuration signals across the breadth of the FPGA.

Some FPGAs utilizing the architecture illustrated in FIG. 7 include additional logic blocks that disrupt the regular columnar structure making up a large part of the FPGA. The additional logic blocks may be programmable blocks and/or dedicated logic. For example, the processor block PROC 710 shown in FIG. 7 spans several columns of CLBs and BRAMs.

Note that FIG. 7 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 7 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

Figure 8:
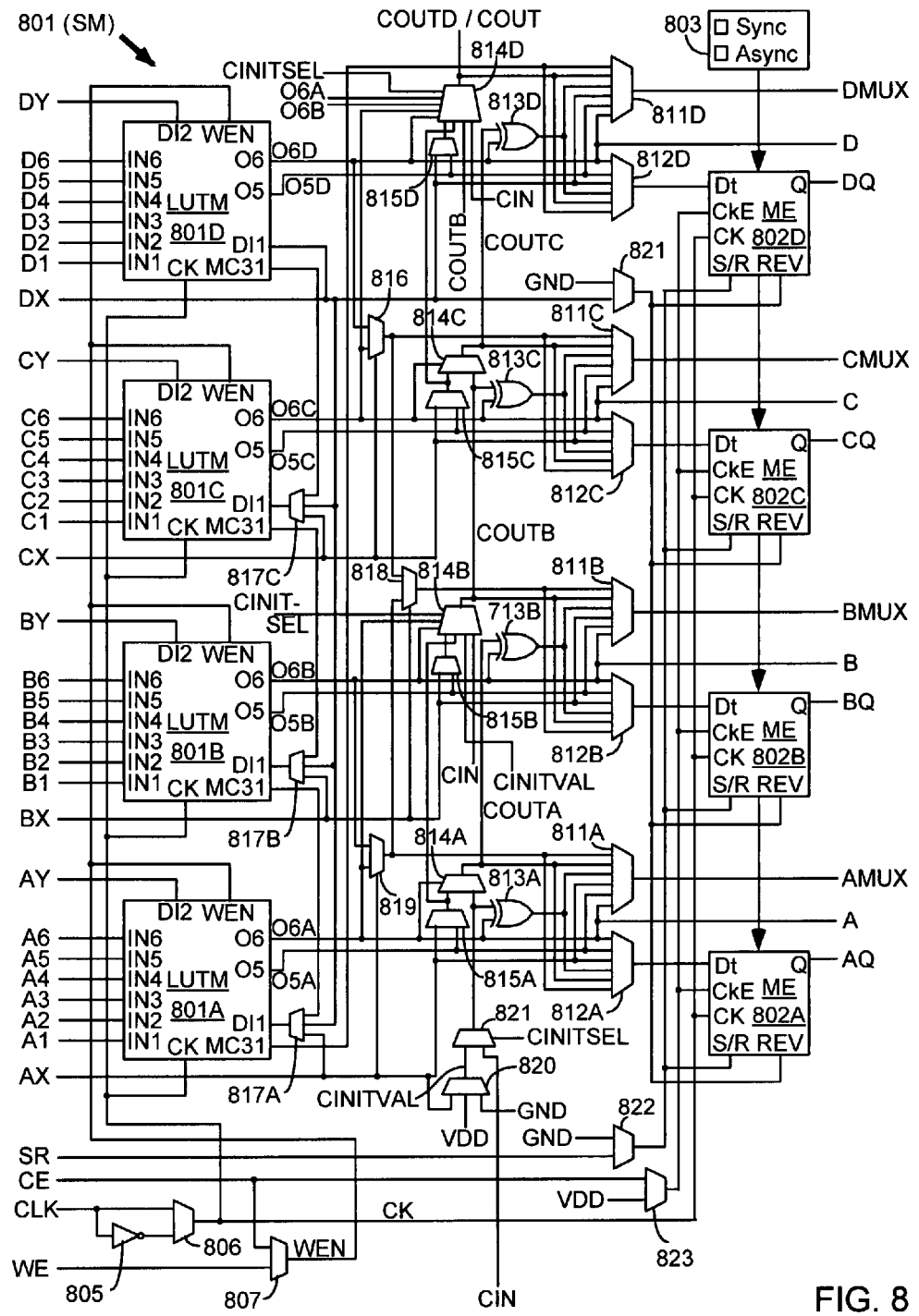
FIG. 8 is a block diagram of a configurable logic element of the programmable logic device of FIG. 7 according to an embodiment of the present invention.

Turning now to FIG. 8, a block diagram of a configurable logic element of the programmable logic device of FIG. 7 according to an embodiment of the present invention is shown. In particular, FIG. 8 illustrates in simplified form a configurable logic element of a configuration logic block 702 of FIG. 7. In the embodiment of FIG. 8, slice M 801 includes four lookup tables (LUTMs) 801A-801D, each driven by six LUT data input terminals A1-A6, B1-B6, C1-C6, and D1-D6 and each providing two LUT output signals O5 and O6. The O6 output terminals from LUTs 801A-801D drive slice output terminals A-D, respectively. The LUT data input signals are supplied by the FPGA interconnect structure via input multiplexers, which may be implemented by programmable interconnect element 811, and the LUT output signals are also supplied to the interconnect structure. Slice M also includes: output select multiplexers 811A-811D driving output terminals AMUX-DMUX; multiplexers 812A-812D driving the data input terminals of memory elements 802A-802D; combinational multiplexers 816, 818, and 819; bounce multiplexer circuits 822-823; a circuit represented by inverter 805 and multiplexer 806 (which together provide an optional inversion on the input clock path); and carry logic comprising multiplexers 814A-814D, 815A-815D, 820-821 and exclusive OR gates 813A-813D. All of these elements are coupled together as shown in FIG. 8. Where select inputs are not shown for the multiplexers illustrated in FIG. 8, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 8 for clarity, as well as from other selected figures herein.

In the pictured embodiment, each memory element 802A-802D may be programmed to function as a synchronous or asynchronous flip-flop or latch. The selection between synchronous and asynchronous functionality is made for all four memory elements in a slice by programming Sync/Asynch selection circuit 803. When a memory element is programmed so that the S/R (set/reset) input signal provides a set function, the REV input terminal provides the reset function. When the memory element is programmed so that the S/R input signal provides a reset function, the REV input terminal provides the set function. Memory elements 802A-802D are clocked by a clock signal CK, which may be provided by a global clock network or by the interconnect structure, for example. Such programmable memory elements are well known in the art of FPGA design. Each memory element 802A-802D provides a registered output signal AQ-DQ to the interconnect structure. Because each LUT 801A-801D provides two output signals, O5 and O6, the LUT may be configured to function as two 5-input LUTs with five shared input signals (IN1-IN5), or as one 6-input LUT having input signals IN1-IN6.

In the embodiment of FIG. 8, each LUTM 801A-801D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 817A-817C for LUTs 801A-801C), or to the two 32-bit RAMs via input terminals DI1 and DI2. RAM write operations in the LUT RAMs are controlled by clock signal CK from multiplexer 806 and by write enable signal WEN from multiplexer 807, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 701A may also be provided to the general interconnect structure for shift register chaining, via output select multiplexer 811D and CLE output terminal DMUX. The devices having programmable logic and methods of the present invention may be implemented according to the device of FIGS. 7 and 8, or in any device, including any type of integrated circuit having programmable logic.

Figure 9:
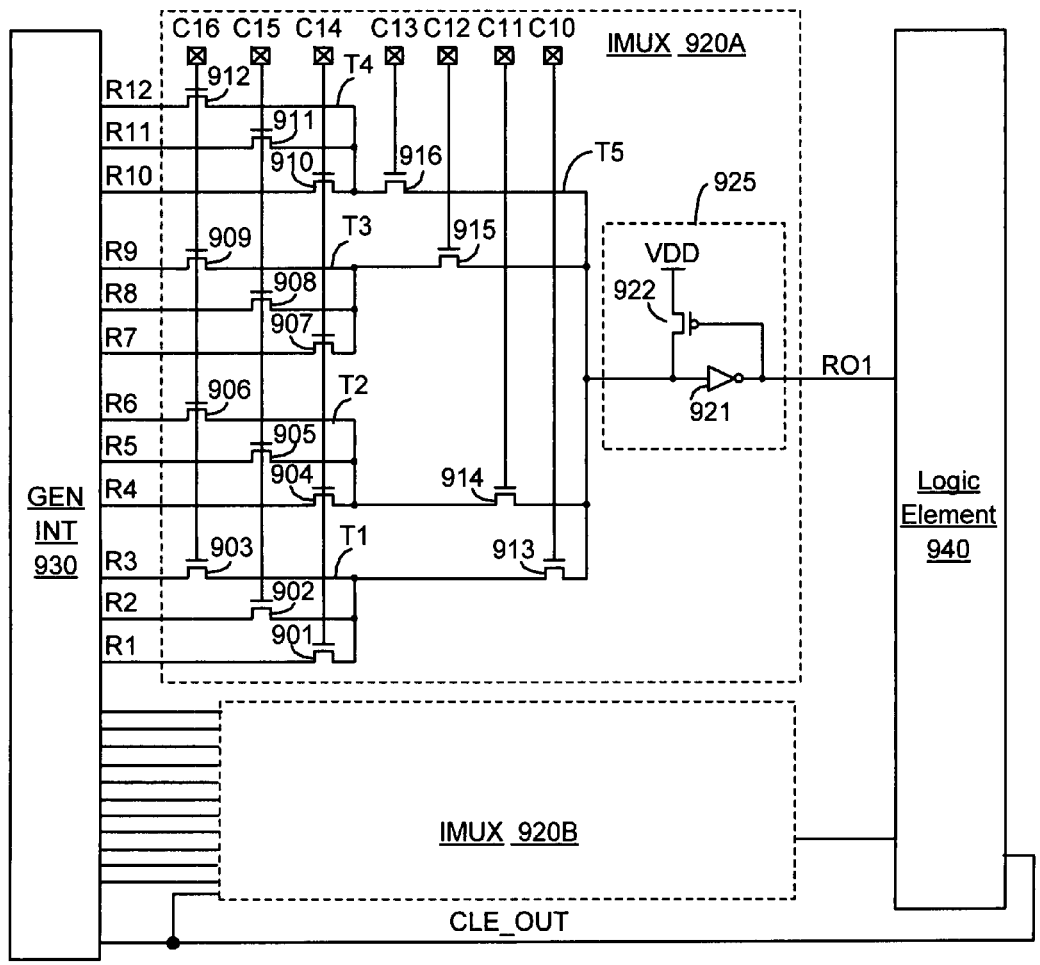
FIG. 9 is a block diagram of interconnect logic of the programmable logic device of FIG. 7 according to an embodiment of the present invention.

Turning now to FIG. 9, a block diagram of exemplary interconnect logic of the programmable logic device of FIG. 7 according to an embodiment of the present invention is shown. In particular, FIG. 9 illustrates how a programmable input multiplexer 920 may be used to provide additional routing flexibility between the general interconnect structure 930 and a configurable logic element 940, wherein longer paths may be created in the general interconnect structure to meet timing requirements. An input multiplexer provides the ability to select one of many different interconnect lines to provide a signal to a CLE input terminal. An input multiplexer may be implemented, for example, as shown in FIG. 9. The illustrated circuit selects one of several different input signals and passes the selected signal to an output terminal. Note that FIG. 9 illustrates an input multiplexer with twelve inputs, but programmable logic device input multiplexers typically have many more inputs, e.g., 20, 24, 28, 30, 36, or some other number. However, FIG. 9 illustrates a smaller circuit, for clarity.

Each input multiplexer 920A, 920B of FIG. 9 includes twelve input terminals R1-R12 and sixteen pass gates 901-916. Pass gates 901-903 selectively pass one of input signals R1-R3, respectively, to a first internal node T1. Each pass gate 901-903 has a gate terminal driven by a configuration memory cell C14-C16, respectively. Similarly, pass gates 904-906 selectively pass one of input signals R4-R6, respectively, to a second internal node T2. Each pass gate 904-906 has a gate terminal driven by one of the same configuration memory cells C14-C16, respectively. From internal nodes T1, T2, pass gates 913, 914 are controlled by configuration memory cells C10, C11, respectively, to selectively pass at most one signal to another internal node T5. Pass gates 907-912 and 915-916 are similarly controlled by configuration memory cells C12-C16 to select one of input signals R7-R12 and to pass the selected input signal via one of internal nodes T3, T4 to internal node T5, as shown in FIG. 9. The signal on internal node T5 is pulled up by structure 925 to provide a full swing output signal RO1. Buffer 925 includes an inverter 921 and a pull-up (e.g., a P-channel transistor 922 to power high VDD) on internal node T5 and driven by the output of inverter 921. Thus, values stored in configuration memory cells C10-C16 select at most one of the input signals R1-R12 to be passed to internal node T5, and hence to output node RO1. If none of the input signals is selected, output signal RO1 may be held at a low value by pull-up 922. The interconnect logic of FIG. 9 and other interconnect elements of the general interconnect structure 930 may be used to adjust the delay time of the nets to meet the minimum timing requirement.

Figure 10:
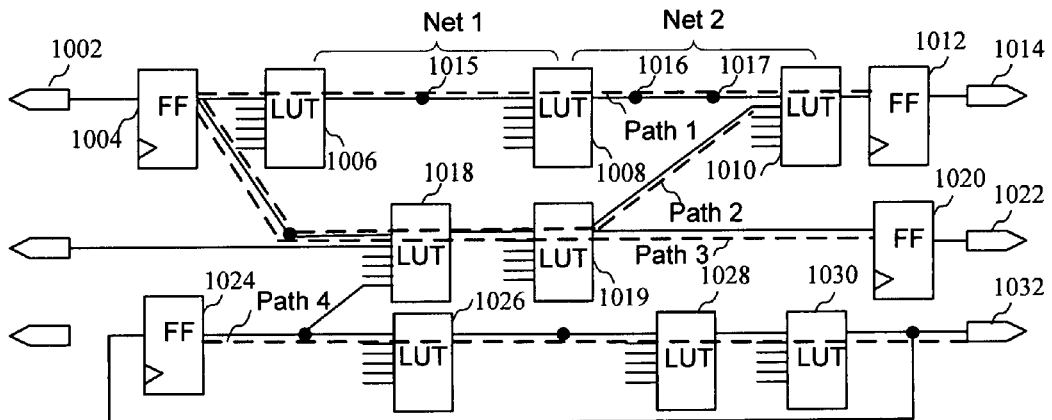
FIG. 10 is a block diagram showing an example of nets and paths in a programmable logic device according to an embodiment of the present invention.

Turning now to FIG. 10, a block diagram of an example of nets and paths in a programmable logic device according to an embodiment of the present invention is shown. In particular, an input/output (I/O) port 1002, which may comprise a primary input, is coupled to an input of a register 1004, shown here as a flip-flop (FF), the output of which is coupled to an input of a LUT 1006. Some inputs of LUTs and FFs in FIG. 10 are shown without nets attached. These nets may connect to other nets, LUTs or FFs, but are not shown for clarity. The output of the LUT 1006 is coupled to a second LUT 1008, the output of which is coupled to a third LUT 1010. The output of the LUT 1010 is coupled to a register 1012 which is coupled to an I/O port 1014. I/O port 1014 may comprise a primary output. By way of example, a first path extends from the register 1004 to a register 1012 by way of LUT 1006, LUT 1008, and LUT 1010. Also shown by way of example, a first net (Net1) is defined between LUT 1006 and LUT 1008, and comprises one interconnect point 1015 connecting two interconnect wire segments. The interconnect point may comprise a programmable interconnect point (PIP). For example, the interconnect point could comprise a programmable multiplexing network similar to the multiplexing network 920A of FIG. 9, for example, or some other suitable multiplexing network. In contrast, a second net (Net2) extending from the LUT 1008 to the LUT 1010 comprises two interconnect points 1016 and 1017 connecting interconnect wire segments. As described above, the connection from the output of one LUT to the input of another LUT may be established by a number of different nets which may comprise different delays and may be selected to comprise a desired delay or meet a minimum delay. A second path, path 2, between the register 1004 and the register 1012 is shown extending through LUTs 1018 and 1019, and back to LUT 1010. A third path extends from register 1004 through LUTs 1018 and 1019 to register 1020, the output of which is coupled to an I/O port 1022. The output of a register 1024 is coupled by way of LUTs 1026-1030 to an I/O port 1032, as shown by path 4. A feedback loop is also shown, which would be considered a separate path. The interconnect multiplexers of FIG. 9 may be used to provide input flexibility between a general interconnect structure and configurable logic elements in FIG. 10 and enable adjusting nets to meet a minimum timing constraint. The embodiment of FIG. 10 is merely provided by way of example to show nets and paths in programmable logic of a programmable logic device. However, it should be understood that the nets may include many additional interconnect segments and interconnect points, while the paths may include many additional LUTs and registers.

Figure 11:
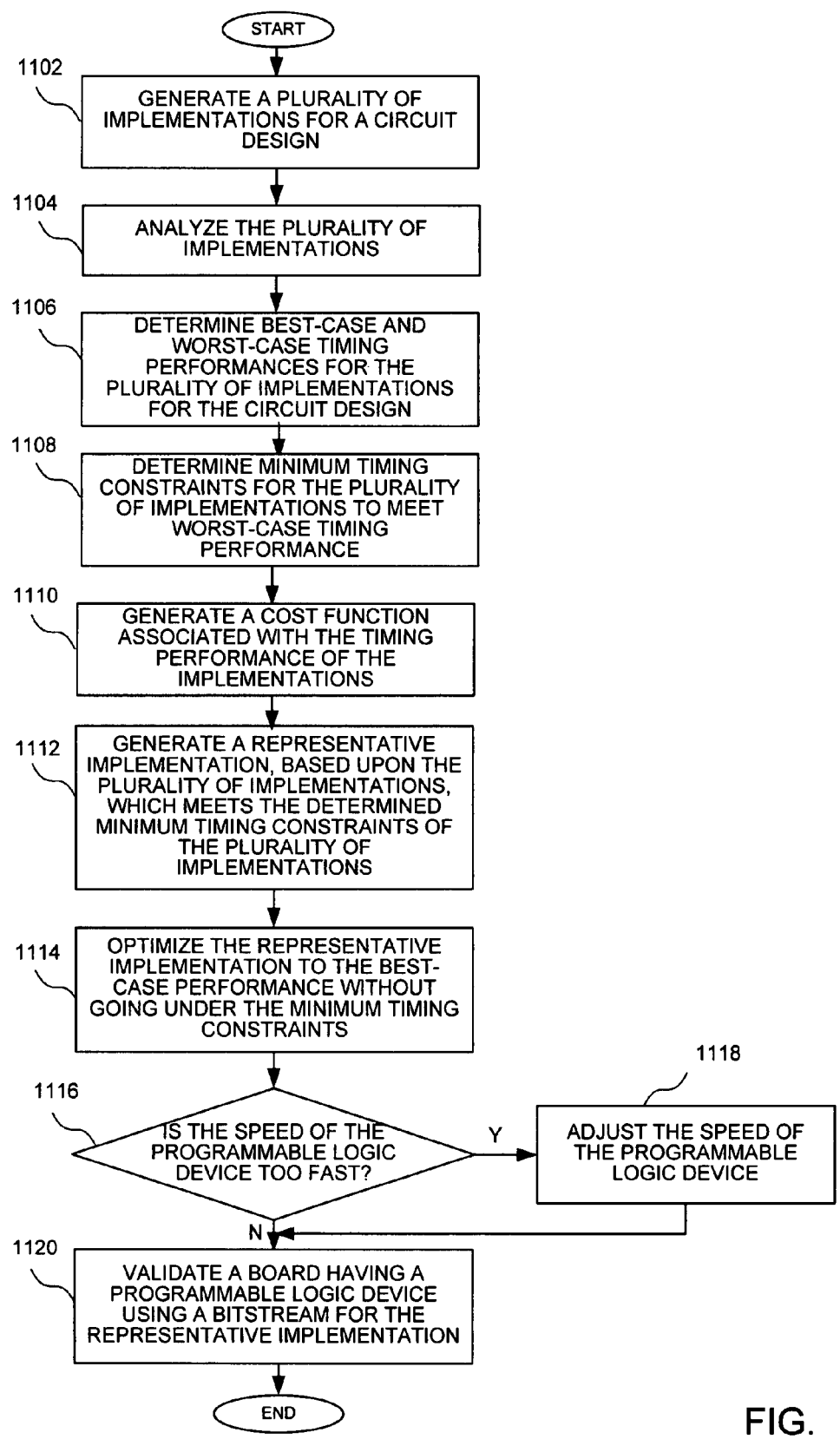
FIG. 11 is a flow chart showing a method of validating a programmable logic device on a system according to an embodiment of the present invention.

Turning now to FIG. 11, a flow chart shows a method of validating a programmable logic device on a circuit board according to an embodiment of the present invention. In particular, a plurality of implementations for a circuit design is generated at a step 1102. The plurality of implementations is analyzed at a step 1104. The best-case and worst-case timing performances are determined for the plurality of implementations for the circuit design at a step 1106. Minimum timing constraints are determined for the plurality of implementations to meet worst-case timing performance at a step 1108. A cost function associated with the timing performance of the implementations is generated at a step 1110. A representative implementation, based upon the plurality of implementations, is generated to meet the determined minimum timing constraints of the plurality of implementations at a step 1112. The representative implementation is optimized to the best-case performance without going under the minimum timing constraints at a step 1114. It is then determined whether the speed of the programmable logic device is too fast at a step 1116. If so, the speed of the programmable logic device is adjusted at a step 1118. A circuit board having the programmable logic device is then validated using a bitstream for the representative implementation at a step 1120. The best-case and worst-case timing performances, minimum timing constraints, representative bitstream and cost function may be generated as described above according to any embodiments of the circuits of FIGS. 1-10.

It can therefore be appreciated that a new and novel method of enabling the validation of a programmable logic device has been described. It will be appreciated by those skilled in the art that numerous alternatives and equivalents will be seen to exist which incorporate the disclosed invention. As a result, the invention is not to be limited by the foregoing embodiments, but only by the following claims.

What is claimed is:

1. A method of enabling the validation of an integrated circuit in a system for each implementation of a plurality of implementations for a circuit design in the integrated circuit using a representative implementation for the circuit design, the method comprising:
    analyzing the plurality of implementations for the circuit design;
    determining minimum timing constraints based upon each implementation of the plurality of implementations for the circuit design;
    generating the representative implementation, based upon the plurality of implementations, wherein the representative implementation meets the determined minimum timing constraints for the plurality of implementations; and
    outputting the representative implementation.

2. The method of claim 1, further comprising determining best-case and worst-case timing performances for the plurality of implementations for the circuit design, wherein determining minimum timing constraints comprises determining minimum timing constraints to meet the worst-case timing performance.

3. The method of claim 2, further comprising generating a cost function associated with the timing performance of the circuit design.

4. The method of claim 3, further comprising optimizing the timing of the representative implementation to the best-case timing performance without going under the minimum timing constraints.

5. The method of claim 3, wherein determining the minimum timing constraints comprises determining minimum path delays.

6. The method of claim 5, wherein generating the cost function comprises generating the cost function based upon minimum path delays between a primary input and a register.

7. The method of claim 5, wherein generating the cost function comprises generating the cost function based upon minimum path delays between a register and a primary output.

8. A method of enabling the validation of an integrated circuit in a system for each implementation of a plurality of implementations for a circuit design in the integrated circuit using a representative implementation for the circuit design, the method comprising:
    determining best-case and worst-case timing performances for the plurality of implementations for the circuit design;
    determining minimum timing constraints to meet the worst-case timing performance;
    generating the representative implementation, based upon the plurality of implementations, which meets the determined minimum timing constraints of the plurality of implementations;
    optimizing timing of the representative implementation to the best-case timing performance without going under the minimum timing constraints; and
    outputting the representative implementation.

9. The method of claim 8, wherein determining the best-case and worst-case performances for the plurality of implementations comprises determining best-case and worst-case performances for the plurality of implementations for all nets of the circuit design.

10. The method of claim 9, wherein optimizing the timing of the representative implementation comprises generating a cost function to minimize a sum of amounts by which the minimum timing constraints for the nets is exceeded.

11. The method of claim 9, wherein optimizing the timing of the representative implementation comprises generating a cost function to minimize an amount by which the minimum timing constraint for any net is exceeded.

12. The method of claim 8, wherein determining the minimum timing constraints comprises establishing minimum path delays between registers.

13. The method of claim 8, wherein determining the minimum timing constraints comprises establishing minimum path delays between a primary input and a register or minimum path delays between a register and a primary output.

14. The method of claim 8, wherein optimizing the timing of the representative implementation comprises performing place and route operations to improve performance of the representative implementation.

15. A method of enabling the validation of an integrated circuit adapted to receive one of a plurality of configuration bitstreams for a circuit design, the method comprising:
    analyzing a plurality of implementations for the circuit design;
    determining minimum timing constraints based upon each implementation of the plurality of implementations for the circuit design;
    generating, by a computer, a representative implementation, based upon the plurality of implementations, which meets the determined minimum timing constraints for the plurality of implementations;
    analyzing a speed of a selected integrated circuit configured with the representative implementation;
    adjusting the speed of the selected integrated circuit to avoid exceeding a predetermined speed; and
    validating the plurality of implementations using the selected integrated circuit configured with the representative implementation.

16. The method of claim 15, wherein determining the minimum timing constraints comprises one of a group of steps consisting of:
    determining minimum path delays between logic circuits;
    determining minimum path delays between registers;
    determining a minimum path delay between a primary input and a register; and
    determining a minimum path delay between a register and a primary output.

17. The method of claim 15, further comprising optimizing timing of the representative implementation to a best-case timing performance without going under the minimum timing constraints.

18. The method of claim 17, wherein optimizing the timing of the representative implementation comprises minimizing a sum of amounts by which minimum path delays for all paths in the circuit design is exceeded.

19. The method of claim 17, wherein optimizing the timing of the representative implementation comprises minimizing an amount by which a minimum path delay for any path is exceeded.

20. The method of claim 15, further comprising validating a system having an integrated circuit using the representative implementation.

* * * * *